United States Patent [19]

Sanchez

[11] Patent Number: 5,638,958
[45] Date of Patent: Jun. 17, 1997

[54] SEMICONDUCTOR FILM WAFER CASSETTE

[75] Inventor: Jose L. Sanchez, Boise, Id.

[73] Assignee: Micron Technology, Inc., Boise, Id.

[21] Appl. No.: 662,978

[22] Filed: Jun. 13, 1996

Related U.S. Application Data

[63] Continuation of Ser. No. 526,042, Sep. 8, 1995, abandoned.

[51] Int. Cl.$^6$ .................................................. B65D 85/30
[52] U.S. Cl. ........................... 206/710; 206/456; 206/711; 211/41.12; 118/500
[58] Field of Search ............................... 206/710, 711, 206/454–456; 118/500; 211/40–41, 417; 414/936, 941

[56] References Cited

U.S. PATENT DOCUMENTS

| | | | |
|---|---|---|---|
| 3,682,083 | 8/1972 | Puente | 206/454 |
| 3,877,134 | 4/1975 | Shanahan | 211/41 |
| 4,153,164 | 5/1979 | Hofmeister et al. | 206/454 |
| 4,176,751 | 12/1979 | Gillissie | 206/328 |
| 4,493,418 | 1/1985 | Johnson | 206/454 |
| 4,600,231 | 7/1986 | Sickles | 211/41 |
| 4,724,963 | 2/1988 | Mortensen | 206/454 |
| 5,308,993 | 5/1994 | Holman et al. | 250/561 |
| 5,351,836 | 10/1994 | Mori et al. | 118/500 |
| 5,364,144 | 11/1994 | Satterfield et al. | 206/711 |

OTHER PUBLICATIONS

Kulicke and Soffa Industries, Inc. catalogue pages showing Series 376 Cassette.

Primary Examiner—Paul T. Sewell
Assistant Examiner—Luan K. Bui
Attorney, Agent, or Firm—Ormiston Korfanta Dunbar & Holland

[57] ABSTRACT

A cassette having two side panels, wafer dividers, two retaining combs and a pair of locking collars. Each retaining comb includes an elongated stringer, a hook shaped upper flange at the upper end of the stringer, a hook shaped lower flange at the lower end of the stringer, and a plurality of projections connected to the stringer. The projections are positioned vertically adjacent to one another at spaced apart intervals thereby defining a series of truncated slots. The projections have the same cross-sectional size and shape as the dividers. The retaining combs are operatively coupled to the side panels by means of hook shaped flanges positioned in a pair of complementary notches formed in a top edge and a bottom edge of the side panels. Thus, the retaining combs may slide vertically along the side panels but are prevented from moving laterally, thereby retaining the combs in place except when the retaining combs are moved into an extreme upward or downward position. The locking collars are each attached to one of the side panels immediately adjacent to the notches. Each collar includes a blocking portion that blocks the lateral movement of the upper flanges thereby preventing the retaining combs from being de-coupled from the side panels.

20 Claims, 6 Drawing Sheets

SEMICONDUCTOR FILM WAFER CASSETTE

This application is a continuation of application Ser. No. 08/526,042, filed Sep. 8, 1991, now abandoned.

FIELD OF THE INVENTION

The invention relates generally to semiconductor processing equipment and, more particularly, to semiconductor wafer cassettes.

BACKGROUND OF THE INVENTION

Semiconductor wafers are frequently transferred from one processing station to another via cassettes that have a series of parallel slots each of which receives and holds a single wafer. In some cases, the cassettes are sized and shaped to receive and hold a film frame or similar device upon which the wafer has been mounted for processing in sawing and die attach equipment. Wafers, or the film frames upon which wafers have been mounted, are typically loaded into and unloaded from a cassette automatically by the processing machine or another robotic mechanism. Although automated cassette transport systems are known in the industry, most cassettes are transferred from one processing station to another by hand. The hand transportation of the cassettes significantly increases the risk that the cassettes will be mishandle and the wafers damaged. Conventional film frame and wafer cassettes have several disadvantages that make the wafers held therein particularly susceptible to accidental damage. In some cassettes, a substantial portion of the film frame upon which the wafer is mounted extends outside one or both ends of the cassette. The exposed portions of the film frame may be inadvertently bumped, snagged or otherwise disturbed during handling thus increasing the risk of damage to the wafer. Similarly, much of the top wafer in a conventional cassette is exposed and, consequently, the surface of the top wafer is often scratched or otherwise damaged during transfer or other handling operations.

Another problem associated with the handling of conventional cassettes is the excessive lateral movement of the frames/wafers when the cassette is tilted. Conventional cassettes allow the film frames to move laterally between ½ inch and 1 ½ inches when the cassette is tilted. The momentum attained by the frames/wafers as they slide through this distance may be sufficient to overcome the retaining mechanism, particularly if the cassette is abruptly bumped or jarred. A further problem that has been observed in the use of conventional film frame and wafer cassettes is that the retaining mechanism can and sometimes is overridden by the human operator/handler. That is, the retaining comb is locked into the open position. This is particularly a problem during operations in which the cassettes are loaded by hand. If the operator fails to "unlock" the retaining comb after the cassette is loaded, then the frames/wafers will readily slide out of the cassette. The cost associated with losing or substantially damaging even one wafer is a significant.

The present invention is directed to the resolution or amelioration of the above stated problems observed with regard to some types of conventional film frame and wafer cassettes.

SUMMARY OF THE INVENTION

Accordingly, it is one object of the invention to keep the film frame completely within the cassette so that no portion of the film frame or wafer is exposed outside the body of the cassette.

It is another object to reduce the extent to which the film frame can move once it is loaded into the cassette.

It is another object to prevent the operator from overcoming the automatic retaining features of the cassette.

It is another object to cover the whole of the top wafer in the cassette.

These and other objects and advantages are achieved by a cassette having two side panels, wafer dividers, two retaining combs and a pair of locking collars. The side panels are positioned opposite and parallel to one another and are spaced apart a distance sufficient to allow the horizontal passage of the film frame or wafer therebetween. A plurality of elongated opposing dividers extend horizontally along and project inwardly from an inner surface of each side panel for supporting the objects along a portion of their perimeter. The dividers on each panel are positioned vertically adjacent to one another at spaced apart intervals thereby defining a series of first slots into which the film frame or wafer may be inserted. Each retaining comb includes an elongated stringer, a hook shaped upper flange at the upper end of the stringer, a hook shaped lower flange at the lower end of the stringer, and a plurality of projections connected to the stringer. The projections are positioned vertically adjacent to one another at spaced apart intervals thereby defining a series of truncated second slots. The projections and second slots have the same cross-sectional size and shape as the dividers and first slots, respectively. The projections extend inwardly from the inner surface of the side panels coextensive with the dividers. The retaining combs are operatively coupled to the side panels by means of the hook shaped flanges positioned in a pair of complementary notches formed in a top edge and a bottom edge of the side panels. Thus, the retaining combs may slide vertically along the side panels but are prevented from moving laterally, thereby retaining the combs in place except when the retaining combs are moved into an extreme upward or downward position. The locking collars are each attached to one of the side panels immediately adjacent to the notches. Each collar includes a blocking portion that blocks the lateral movement of the upper flanges thereby preventing the retaining combs from being de-coupled from the side panels.

The film frame wafer cassette of the present, wherein a locking collar keeps the retaining combs in place on the side panels, prevents the operator from overcoming the automatic retaining features of the cassette. The other objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

To illustrate the preferred embodiment of the invention, the invented cassette will be described for use in storing and transporting wafers that have been mounted on a film frame for final stage process steps, such as wafer sawing and die attach. The invention, however, is applicable in general to many of the various types of cassettes used to store and transport semiconductor wafers.

Figure 4:
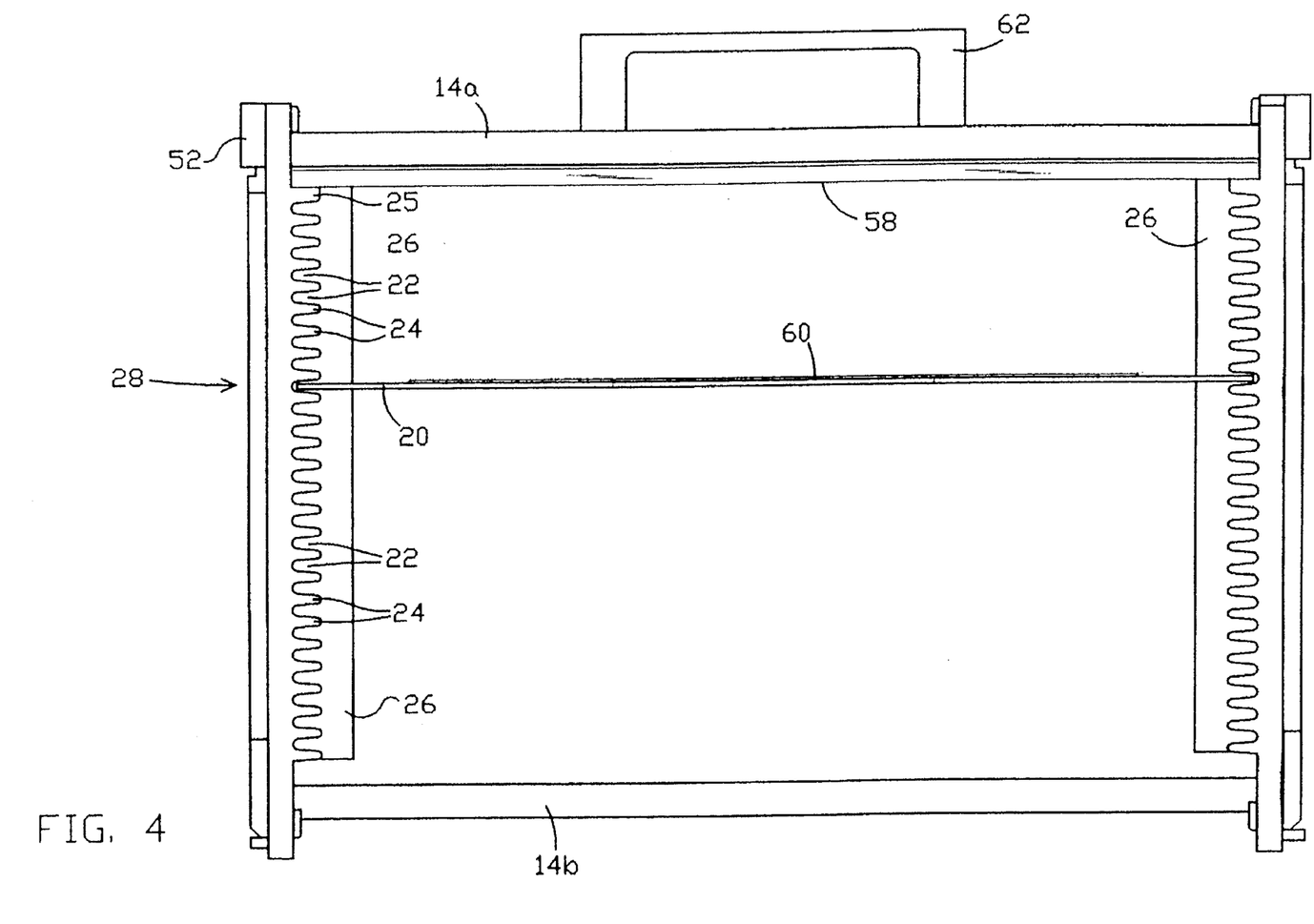
FIG. 4 is a front elevation view of the preferred embodiment of the invented film frame wafer cassette showing the film frame and wafer in the cassette with the retaining comb in the unlocked position.
Figure 5:
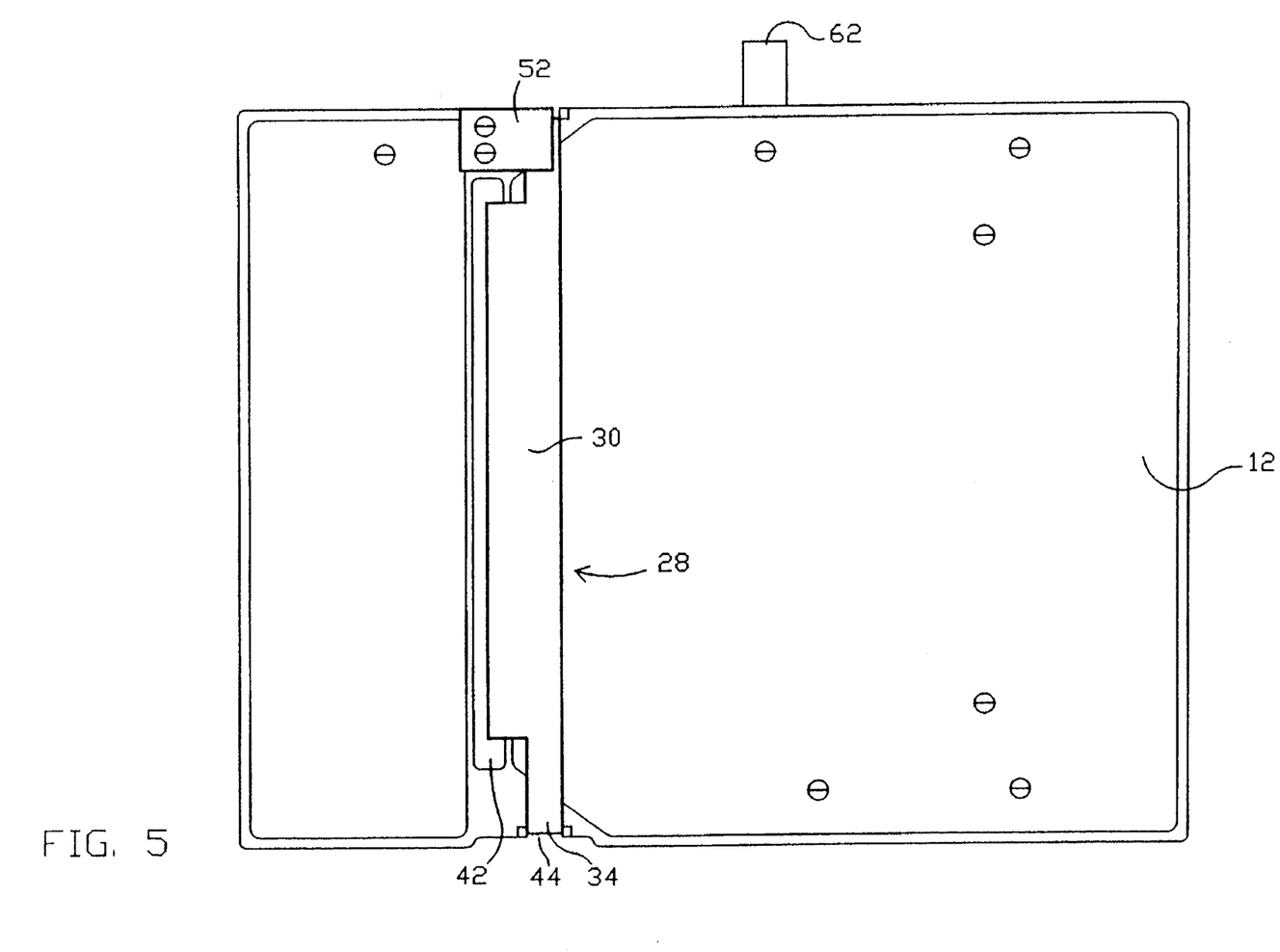
FIG. 5 is a side elevation view of the preferred embodiment of the invented film frame wafer cassette.
Figure 6:
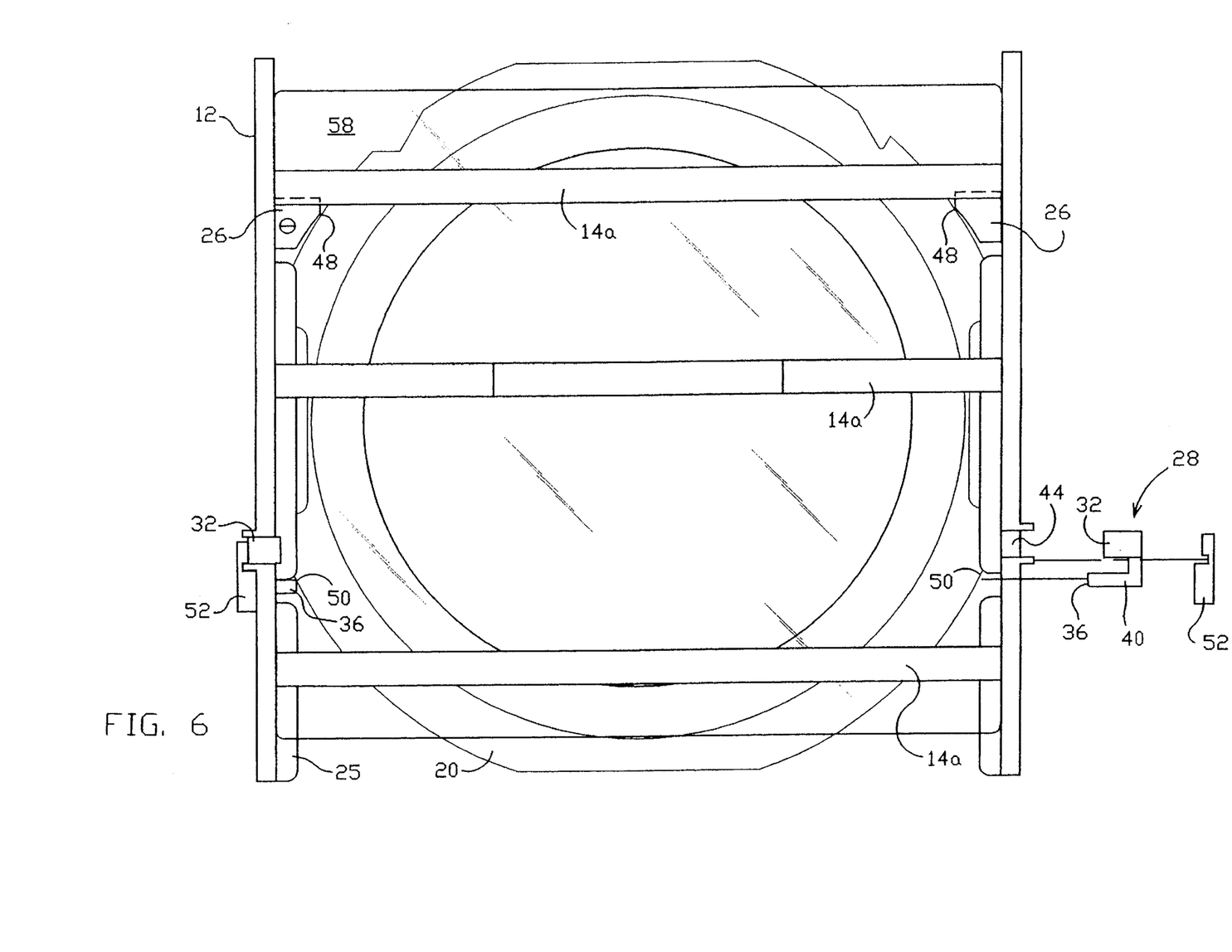
FIG. 6 is a top-down plan view of the preferred embodiment of the invented film frame wafer cassette.

Referring to FIGS. 1-6, the film frame wafer cassette of the present invention is indicated generally by reference number 10. Side panels 12 are positioned opposite and parallel to one another. Upper cross bars 14a and lower cross bars 14b extend between and connect side panels 12 to provide lateral structural support therefore. Side panels 12 are constructed as substantially flat rectangular plates having an inner surface 16 and an outer surface 18. Side panels 12 and cross bars 14 may be made of any suitable structurally stable, preferably lightweight, material. Cross bars 14 are constructed as elongated rods whose length is approximately equal to the width of film frame 20 (film frame 20 is shown in FIGS. 4 and 6.).

Figure 7:
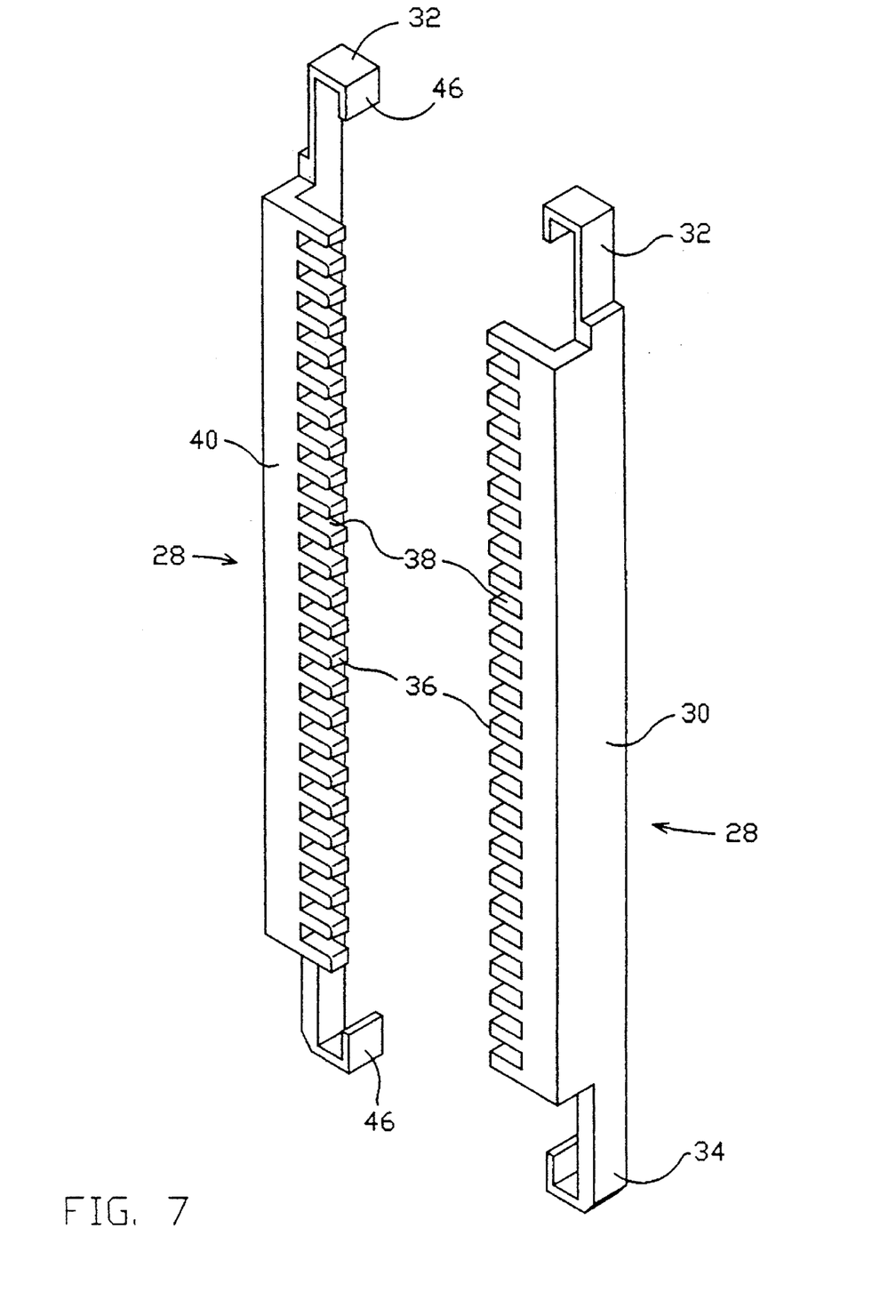
FIG. 7 is an expanded detail view of the retaining combs.

A series of first slots 22 extend along the inner surfaces 16 of side panels 12. Slots 22 are defined by elongated dividers 24. Dividers 24 consist of tooth shaped projections in opposing alignment with one another. Preferably, dividers 24 are formed as an integral part of inner surfaces 16 of side panels 12. Dividers 24 correspond to the size and shape of the opposing perimeters of film frame 20 to support film frame 20, as best shown in FIGS. 4 and 6. The film frames are inserted into opposing slots for transport between processing stations. Rear stops 26 are attached to inner surfaces 16 of side panels 12 near the rear of slots 22. Referring to FIG. 7, retaining comb 28 is disposed along the outer surfaces 18 of side panels 12. Retaining combs 28 consist of an elongated substantially flat first stringer 30, hook shaped upper flange 32, hook shaped lower flange 34 and tooth shaped projections 36 defining a series of truncated second slots 38. Projections 36 project from a substantially flat second stringer 40 which extends along substantially the entire length of one side of stringer 30 in a plane that is perpendicular to the plane defined by first stringer 30. Projections 36 have the same cross-sectional size and shape as dividers 24 and, correspondingly, slots 38 have the same cross-sectional size and shape as slots 22.

Figures 1A, 2, 3:
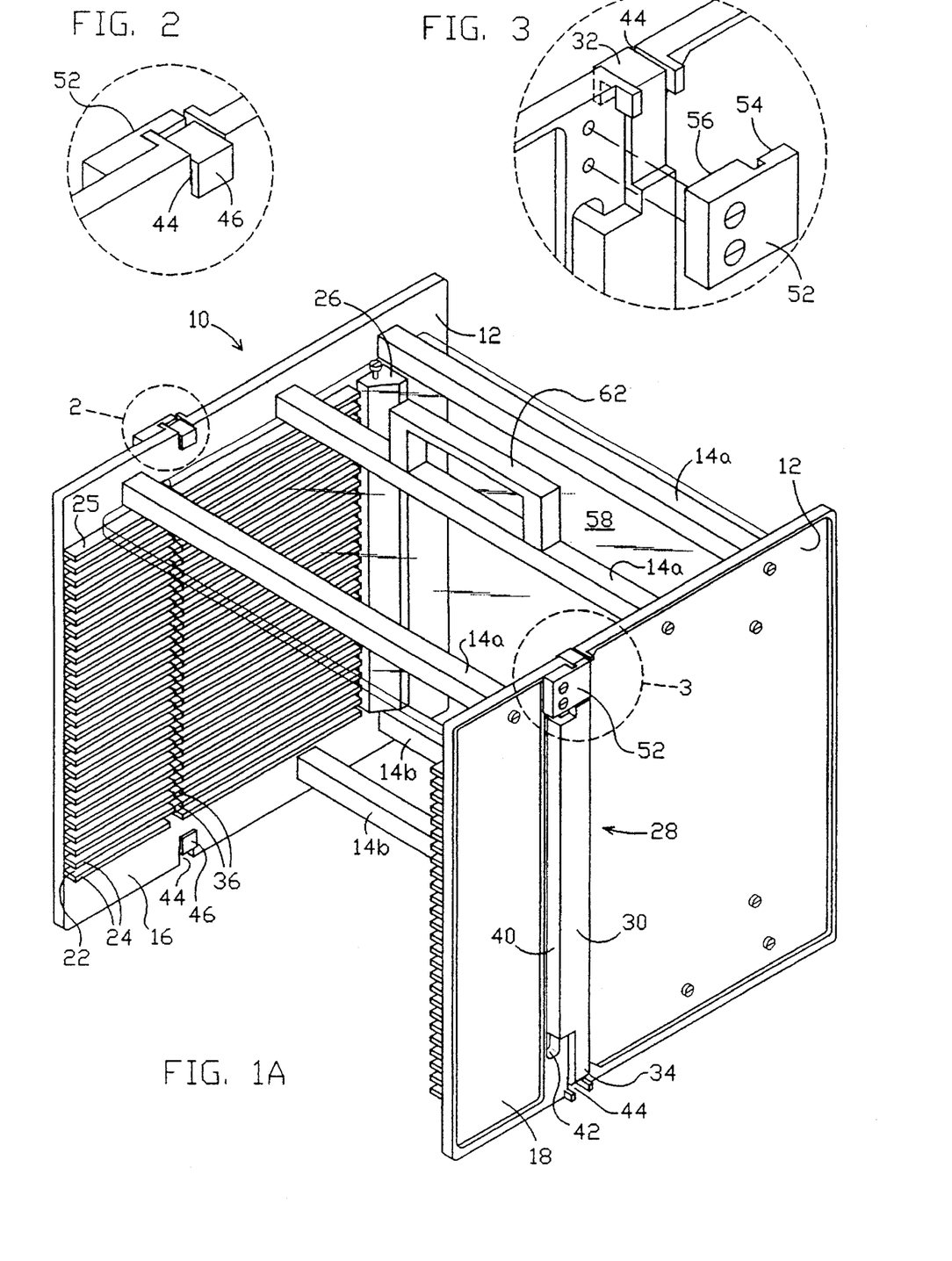
FIG. 1A is a perspective view of the preferred embodiment of the invented film frame wafer cassette showing the retaining comb in the unlocked position.
FIG. 2 is an expanded detail view of the interconnection between the retaining comb upper flange, the notch through which it is coupled to the side panel, and the locking collar.
FIG. 3 is an expanded exploded detail view of the interconnection between the retaining comb upper flange, the notch through which it is coupled to the side panel, and the locking collar.
Figure 1B:
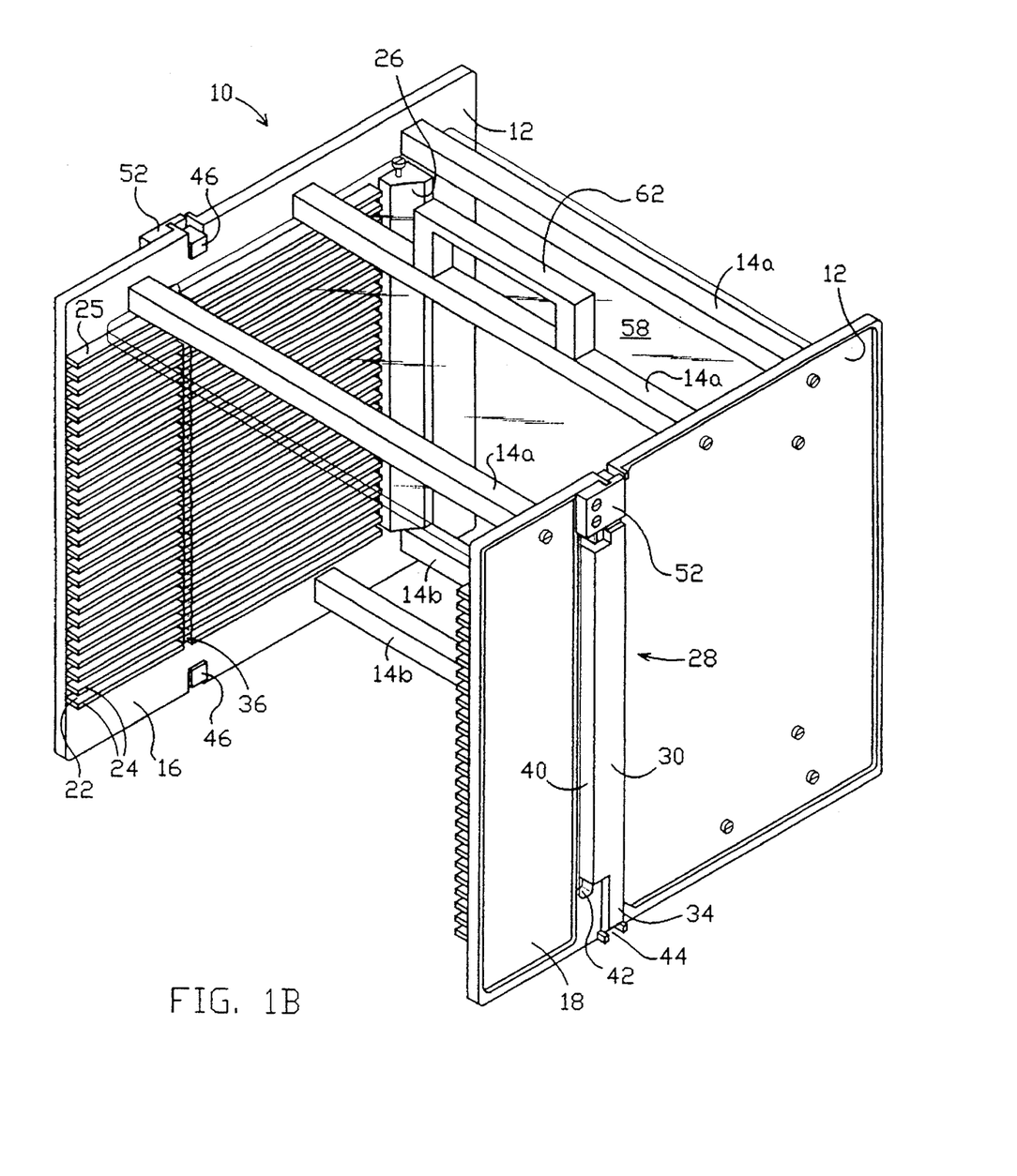
FIG. 1B is a perspective view of the preferred embodiment of the invented film frame wafer cassette showing the retaining comb in the locked position.

Referring again to FIGS. 1-6, retaining combs 28 are installed on side panels 12 so that projections 36 extend through elongated openings 40 in side panels 12, as best seen in FIG. 1A and 5. Second stringer 40 is sized so that projections 36 are coextensive with dividers 24 when retaining combs 28 are installed on side panels 12. Retaining combs 28 are retained in place on side panels 12 by means of hook shaped flanges 32 and 34, which are positioned in notches 44 in side panels 12, as best shown in FIGS. 2 and 3. First stringer 30 and flanges 32 and 34 are sized and shaped so that the distance between the tips 46 of flanges 32 and 34 is slightly less than the distance between notches 44 in each of side panels 12. In this way, retaining combs 28 are allowed to travel or "slide" vertically along the outer surfaces 18 of side panels 12 but still be retained in place on side panels 12 except the extreme upward or downward positions. Retaining combs 28 are biased in the downward position by means of a spring (not shown) positioned between lower flanges 34 of retaining combs 28 and notches 44 on the lower edges of side panels 12. In this downward position, projections 36 block slots 22, as shown in FIG. 1B, and thereby retain the film frames in cassette 10. When retaining combs 28 are moved into the upward position, as shown in FIG. 1A, projections 36 are aligned with dividers 24 so that film frames may be inserted into and removed from cassette 10.

Referring to FIG. 6, rear stops 26 are positioned at the rear of slots 22 to engage the rearward portions 48 of the circumferential perimeter of film frame 20 after the forward portions 50 of the circumferential perimeter of film frame 20 have just cleared projections 36. Preferably, the distance between rear stops 26 and projections 36 is no more than 20 mils greater than the distance between the rearward and forward portions 48 and 50 of film frame 20. The above described positioning of rear stops 26 relative to projections 36 prevents excessive lateral movement of film frame 20 in cassette 10. In addition, side panels 12 are made long enough, and retaining combs 28 and rear stops 26 are positioned, so that film frame 20 is fully within cassette 10, as best seen in FIG. 6. Thus, film frame 20 is protected from being inadvertently bumped, snagged or otherwise disturbed during handling.

Referring to FIGS. 1A, 2 and 3, collars 52 are attached to side panels 12 immediately adjacent to notches 44. Collars 52 are substantially flat generally rectangular plates that include a blocking portion 54. Collars 52 prevent an operator from bypassing the automatic retaining feature of the cassette by blocking the lateral movement of upper flange 32 when retaining comb 28 is moved into the upward position. Absent the collar of the present invention, the retaining comb can be wedged into its extreme upper and unlocked position by slipping lip 46 of upper flange 32 laterally over notch 44. Collars 52 prevent the operator from wedging the retaining comb in its extreme upward and unlocked position.

Cover plate 58 protects the otherwise exposed upper surface of wafer 60, as best shown in FIGS. 1A, 4 and 6. Cover plate 58 is preferably positioned between upper cross bars 14a and top dividers 25. Cover plate 58 is also preferably made of a transparent material such as clear plexiglass. Handle 62 is attached to the center upper cross bar to facilitate the transport of the cassette between processing stations.

While the present invention has been shown and described with reference to the foregoing preferred embodiment, it will be apparent to those skilled in the art that other forms and details may be made thereto without departing from the spirit and scope of the invention as defined in the appended claims.

I claim:

1. A cassette for holding thin planar objects, the cassette comprising:

a. two side panels positioned opposite and parallel to one another, the side panels being spaced apart a distance sufficient to allow the horizontal passage of the objects therebetween;

b. a plurality of elongated opposing dividers extending horizontally along and projecting inwardly from an inner surface of each side panel for supporting the objects along a portion of their perimeter, the dividers on each panel being disposed vertically adjacent to one another at spaced apart intervals thereby defining a series of first slots into which the objects may be inserted;

c. at least one retaining comb, each of which comprises an elongated stringer, a hook shaped upper flange disposed at an upper end of the stringer, a hook shaped lower flange disposed at a lower end of the stringer, and a plurality of projections connected to the stringer, the projections being disposed vertically adjacent to one another at spaced apart intervals thereby defining a series of truncated second slots, wherein the projections and second slots have the same cross-sectional size and shape as the dividers and first slots, respectively, and wherein the projections extend inwardly from the inner surface of the side panels coextensive with the dividers;

d. the retaining combs being operatively coupled to the side panels by means of the hook shaped flanges positioned in a pair of complementary notches formed in a top edge and a bottom edge of the side panels so that the retaining combs may slide vertically along the side panels but are prevented from moving laterally, thereby retaining the combs in place on the side panels except when the retaining combs are moved into an extreme upward or downward positions; and e. at least one collar each of which is attached to one of the side panels immediately adjacent to the notches, each collar comprising a blocking portion that blocks the lateral movement of the upper flanges thereby preventing the retaining combs from being de-coupled from the side panels.

2. A cassette according to claim 1, further comprising a plurality of cross bar supports connected to and extending between the side panels to provide lateral support therefore.

3. A cassette according to claim 1, further comprising two rear stops each of which is attached to the inner surface of each side panel near the rear of the first slots to engage a rearward portion of the perimeter of the objects after a forward portion of the perimeter of the objects has just cleared the projections of the retaining combs.

4. A cassette according to claim 1, further comprising a cover plate extending between the side panels above an upper most divider for substantially the entire length of the first slots so that the entire upper surface of the objects inserted into the cassette is covered.

5. A cassette according to claim 1, wherein the side panels have a horizontal length at least as long as the length of the objects inserted therein so that the objects are fully contained within the cassette.

6. A cassette according to claim 1, wherein the objects are semiconductor wafers.

7. A cassette according to claim 1, wherein the objects are semiconductor film frames.

8. A cassette according to claim 3, wherein the distance between the rear stops and the projections is no more than 20 mils greater than the distance between the rearward and forward portions of the perimeter of the objects.

9. A semiconductor film frame wafer cassette, comprising:

a. two side panels positioned opposite and parallel one another, each side panel including a front end, an inner surface, an outer surface, and a vertically elongated opening, the side panels being spaced apart from one another a distance sufficient to allow the horizontal passage of a film frame between the side panels;

b. a plurality of elongated opposing tooth shaped dividers defining therebetween a series of first slots in opposing alignment with one another, the dividers and first slots extending horizontally along the inner surface of each side panel and having a forward portion extending between the front end of the side panel and the vertically elongated opening in the side panel and a rearward portion extending rearward from the vertically elongated opening;

c. two retaining combs each of which is operatively coupled to one of the side panels, each retaining comb comprising an elongated first stringer, a hook shaped upper flange disposed at an upper end of the first stringer, a hook shaped lower flange disposed at a lower end of the first stringer, a second stringer extending along substantially the entire length of one side of the first stringer in a plane that is perpendicular to a plane defined by the first stringer, and a plurality of projections projecting from the second stringer, the projections defining therebetween a plurality of truncated second slots, wherein the projections have the same cross-sectional size and shape as the dividers and wherein the projections extend through the opening in the side panels so that the projections are coextensive with the dividers;

d. the retaining combs being operatively coupled to the side panels by means of the hook shaped flanges positioned in a pair of complementary notches formed in a top edge and a bottom edge of the side panels so that the retaining combs may slide vertically along the side panels but are prevented from moving laterally, thereby being retained in place on the side panels except when the retaining combs are moved into an extreme upward or downward positions; and e. two collars each of which is attached to one of the side panels, each collar comprising a blocking portion wherein the blocking portion blocks the lateral movement of the upper flange of the retaining comb thereby preventing the retaining combs from being de-coupled from the side panels.

10. A cassette according to claim 9, further comprising a plurality of cross bar supports connected to and extending between the side panels to provide lateral support therefore.

11. A cassette according to claim 9, further comprising two rear stops each of which is attached to the inner surface of each side panel near the rear of the first slots to engage a rearward portion of the perimeter of the objects after a forward portion of the perimeter of the objects has just cleared the projections of the retaining combs.

12. A cassette according to claim 9, further comprising a cover plate extending between the side panels above an upper most divider for substantially the entire length of the first slots so that the entire upper surface of the objects inserted into the cassette is covered.

13. A cassette according to claim 9, wherein the side panels have a horizontal length at least as long as the length of the objects inserted therein so that the objects are fully contained within the cassette.

14. A cassette according to claim 9, wherein the objects are semiconductor wafers.

15. A cassette according to claim 9, wherein the objects are semiconductor film frames.

16. A cassette according to claim 11, wherein the distance between the rear stops and the projections is no more than 20 mils greater than the distance between the rearward and forward portions of the perimeter of the objects.

17. A cassette for holding planar objects, comprising:

a. two side panels positioned opposite and parallel to one another, the side panels being spaced apart a distance sufficient to allow the horizontal passage of the objects therebetween;

b. a plurality of elongated opposing dividers extending horizontally along and projecting inwardly from an inner surface of each side panel for supporting the objects along a portion of their perimeter, the dividers on each panel being disposed vertically adjacent to one another at spaced apart intervals thereby defining a series of first slots into which the objects may be inserted;

c. a retainer operatively coupled to a side panel for retaining the objects in the cassette when the objects are inserted into the first slots; and d. a collar attached to the side panel immediately adjacent to the retainer, the collar having a blocking portion that blocks the lateral movement of the retainer to prevent the retainer from being de-coupled from the side panels.

18. A cassette according to claim 17, wherein the retainer comprises an elongated stringer, a hook shaped first flange disposed at one end of the stringer, a hook shaped second flange disposed at the other end of the stringer, and a plurality of projections connected to the stringer, the projections being disposed vertically adjacent to one another at spaced apart intervals thereby defining a series of truncated second slots, wherein the projections and second slots have the same cross-sectional size and shape as the dividers and first slots, respectively, and wherein the projections extend inwardly from the inner surface of the side panel coextensive with the dividers.

19. A cassette according to claim 18, wherein the retainer is coupled to the side panel by means of the hook shaped flanges positioned in a pair of complementary notches formed in the side panel so that the retainer may slide vertically along the side panel but is prevented from moving laterally.

20. A cassette according to claim 19, wherein the blocking portion of the collar blocks the lateral movement of the first flange.

* * * * *